US008086975B2

(12) United States Patent
Shiring et al.

(10) Patent No.: US 8,086,975 B2
(45) Date of Patent: Dec. 27, 2011

(54) POWER AWARE ASYNCHRONOUS CIRCUITS

(75) Inventors: Ken Shiring, Campbell, CA (US); Peter A. Beerel, Encino, CA (US); Andrew Lines, Malibu, CA (US); Arash Saifhashemi, Los Angeles, CA (US)

(73) Assignees: University of Southern California, Los Angeles, CA (US); Fulcrum Microsystems, Inc., Calabasas, CA (US)

( * ) Notice: Subject to any disclaimer, the term of this patent is extended or adjusted under 35 U.S.C. 154(b) by 356 days.

(21) Appl. No.: 12/421,963

(22) Filed: Apr. 10, 2009

(65) Prior Publication Data

US 2009/0288058 A1  Nov. 19, 2009

Related U.S. Application Data

(60) Provisional application No. 61/043,988, filed on Apr. 10, 2008.

(51) Int. Cl.
*G06F 17/50* (2006.01)
(52) U.S. Cl. .......................... 716/103; 716/104; 716/132
(58) Field of Classification Search .................. 716/103, 716/104, 132
See application file for complete search history.

(56) References Cited

U.S. PATENT DOCUMENTS

| 6,658,635 | B1 * | 12/2003 | Tanimoto ...................... 716/108 |
| 6,735,743 | B1 * | 5/2004 | McElvain ...................... 716/112 |
| 7,120,883 | B1 * | 10/2006 | van Antwerpen et al. .... 716/102 |
| 7,689,955 | B1 * | 3/2010 | van Antwerpen et al. .... 716/113 |
| 7,694,266 | B1 * | 4/2010 | Sankaralingam ............. 716/104 |
| 2006/0120189 | A1 | 6/2006 | Beerel et al. |
| 2006/0190851 | A1 | 8/2006 | Karaki et al. |
| 2007/0198238 | A1 | 8/2007 | Hidvegi et al. |
| 2007/0253275 | A1 | 11/2007 | Ja et al. |
| 2007/0256038 | A1 | 11/2007 | Manohar |
| 2009/0271747 | A1 * | 10/2009 | Tanaka .............................. 716/2 |

FOREIGN PATENT DOCUMENTS

| WO | WO 2007/127914 A2 | 11/2007 |
| WO | WO 2008078740 A1 * | 7/2008 |

OTHER PUBLICATIONS

Schuster et al., "Low-Power Synchronous-to-Asynchronous-to-Synchronous Interlocked Piplelined CMOS Circuits Operating at 3.3-4.5 GHz", IEEE Journal of Solid-State Circuits, vol. 38, No. 4, Apr. 2003, pp. 622-630.*
Simlastic et al., "Clockless Implementation of LEON2 for Low-Power Applications", IEEE Design and Diagnostics of Electronic Circuits and Systems, Apr. 11-13, 2007, 4 pages.*

(Continued)

*Primary Examiner* — Phallaka Kik
(74) *Attorney, Agent, or Firm* — McDermott Will & Emery LLP

(57) ABSTRACT

Techniques are described for converting netlists for synchronous circuits such as combinational modules, flip flops (or latches), and clock gating modules, to netlist of asynchronous modules. Processes including algorithms are described that bundle multiple modules in an enable domain, so that they are activated only if the incoming enable token to the enable domain has the UPDATE value. The modules can be clustered inside an enable domain, so that each cluster has a separate controller. The objective function of bundling and clustering can minimize power consumption with respect to a given cycle time. Exemplary embodiments can include a gated multilevel domino template.

20 Claims, 12 Drawing Sheets

Algorithm for original conversion of the synchronous to an asynchronous graph

OTHER PUBLICATIONS

Beerel, P. A. et al. Slack Matching Asynchronous Designs. IEEE International Symposium on Asynchronous Circuits and Systems (ASYNC'06), 2006.

Cortadella, J. et al. Desynchronization: Synthesis of Asynchronous Circuits From Synchronous Specifications. Computer-Aided Design of Integrated Circuits and Systems, IEEE Transactions on. vol. 25, Issue 10, pp. 1904-1921, Oct. 2006.

Fant, K.M. et al. "NULL Convention Logic" (Theseus Logic, Inc.), retrieved from the Internet <http://www.cs.ucsc.edu/~sbrandt/papers/NCL2.pdf>, 1997, 40 pages.

Fraer, R. et al. A New Paradigm for Synthesis and Propagation of Clock Gating Conditions. Design Automation Conference, 2008. DAC 2008. 45th ACM/IEEE, pp. 658-663, Jun. 2008.

Linder, D.H. et al. Phased Logic: Supporting the Synchronous Design Paradigm with Delay-Insensitive Circuitry. Mississippi State Univ., IEEE Transactions, vol. 45, issue 9, pp. 1031-1044, Sep. 1996.

Lines, A.M. Pipelined Asynchronous Circuits. Jun. 1995, revised Jun. 1998, Technical Report, California Institute of Technology, [CaltechCSTR:1998.cs-tr-95-21].

Smirnov, A. et al. Synthesizing Asynchronous Micropipelines with Design Compiler. Proc. SNUG Boston 2006: Synopsys User Group, Sep. 18-19, 2006, Boston, USA.

Sutherland, I. et al. GasP: A Minimal FIFO Control. Proceedings of the Seventh International Symposium on Advanced Research in Asynchronous Circuits and Systems, Salt Lake City, Utah, USA. Mar. 11-14, 2001. pp. 46-53. (IEEE 2001).

Wong, C. et al. High-Level Synthesis of Asynchronous Systems by Data-Driven Decomposition. DAC 2003.

Alidina, M. et al. Precomputation-Based Sequential Logic Optimization for Low Power. 1994. IEEE Transactions on Very Large Scale Integration (VSLI) Systems, Dec. 1994, vol. 2, No. 4, pp. 426-436.

Andrikos, N. et al. 2007. A Fully-Automated Desynchronization Flow for Synchronous Circuits. In Proceedings of the 44th Annual Conference on Design Automation, Jun. 4-8, 2007, San Diego, California, ACM, pp. 982-985.

Bardsley, A. et al. 2000. The Balsa Asynchronous Circuit Synthesis System. In Proceedings of the Forum on Design Languages, Sep. 2000, 8 pages.

Beerel, P. 2002. Asynchronous Circuits: An Increasingly Practical Design Solution. In Proceedings of the International Symposium on Quality Electronic Design (ISQED '02), IEEE, pp. 367-372.

Beerel, P. et al. 2007. Low Power and Energy Efficient Asynchronous Design. Journal on Low Power Electronics, Nov. 2007, vol. 3, No. 3, pp. 234-253.

Benini, L. et al. 1994. Automatic Synthesis of Gated Clocks for Power Reduction in Sequential Circuits. In IEEE Design and Test of Computers, Special Issue, pp. 32-40.

Berkel, K. van. et al. 1991. The VLSI-Programming Language Tangram and Its Translation Into Handshake Circuits. In Proceedings of the European Conference on Design Automation (EDAC), IEEE, pp. 384-389.

Berkel, C.H. (Kees) van et al. 1999. Scanning the Technology: Applications of Asynchronous Circuits. In Proceedings of the IEEE, Feb. 1999, vol. 87, No. 2, pp. 223-233.

Blunno, I. et al. 2004. Handshake Protocols for De-Synchronization. In Proceedings of the International Symposium on Advanced Research in Asynchronous Circuits and Systems. Apr. 2004, pp. 149-158.

Chelcea, T. et al. 2002. A Burst-Mode Oriented Back End for Balsa Synthesis System. In Proceedings of the 2002 Design, Automation and Test in Europe Conference and Exhibition (Date '02), Mar. 2002, pp. 330-337.

Chelcea, T. et al. 2002. Resynthesis and Peephole Transformations for Optimization of Large-Scale Asynchronous Systems. In Proceedings of the 39th Conference on Design Automation, ACM Publishers, pp. 405-410.

Cortadella, J. et al. 2004. From Synchronous to Asynchronous: An Automatic Approach. In Proceedings of the Design Automation and Test in Europe Conference and Exhibition (Date '04), IEEE, pp. 1368-1369.

El-Essawy, W. et al. 2002. A Microarchitectural Level Step-Power Analysis Tool. In Proceedings of the International Symposium on Low Power Electronics and Design, (ISLPED '02), Aug. 12-14, 2002, Monterey, California, ACM, Publishers, pp. 263-266.

Fant, K.M. et al. 1996. NULL Convention Logic (TM): A Complete and Consistent Logic for Asynchronous Digital Circuit Synthesis. In Proceedings of International Conference on Application Specific Systems, Architectures and Processing, Aug. 1996, IEEE, pp. 261-273.

Ferretti, M. et al. 2004, Single-Track Asynchronous Pipeline Templates Using 1-of-N Encoding. Technical Report. University of Southern California, Aug. 2004, 8 pages.

Jacobson, H. et al. 2005. Stretching the Limits of Clock-Gating Efficiency in Server-Class Processors. In Proceedings of the 11th International Symposium on High-Performance Computer Architecture (HPCA-11 2005), Feb. 2005, IEEE, pp. 238-242.

Kessels, J. et al. 2001. The Tangram Framework: Asynchronous Circuits for Low Power. In Proceedings of Asia and South Pacific Design Automation Conference, Feb. 2001, IEEE, pp. 255-260.

Kondratyev, A. et al. 2002. Design of Asynchronous Circuits by Synchronous CAD Tools. In IEEE Design and Test of Computers, Jul./Aug. 2002, vol. 19, No. 4, pp. 107-117.

Ligthart, M. et al. 2000. Asynchronous Design Using Commercial HDL Synthesis Tools. In Proceedings of the International Symposium on Advanced Research in Asynchronous Circuits and Systems, Apr. 2000, pp. 114-125.

Luo, Y. et al. 2005. Low Power Network Processor Design Using Clock Gating. In Proceedings of the 42nd Annual Conference on Design Automation, DAC 2005, Jun. 13-17, 2005, Anaheim, California, ACM Publishers, pp. 712-715.

Manohar, R. et al. 1998. Slack Elasticity in Concurrent Computing. Lecture Notes in Computer Science, vol. 1422, pp. 272-285.

Martin, A. 1986. Compiling Communicating Process into Delay-Insensitive VLSI Circuits. Distributed Computing, vol. 1, No. 4, pp. 226-234.

Ozdag, R.O. 2003. Template Based Asynchronous Design. Doctoral Disseration, University of Southern California, Nov. 2003, 130 pages.

Ozdag, R. et al. 2002. High-Speed QDI Asynchronous Pipelines. In Proceedings of the Eighth International Symposium on Asynchronous Circuits and Systems (ASYNC '02), IEEE, 10 pages.

Papanikolaou, A. et al. 2007. Reliability Issues in Deep Deep Submicron Technologies: Time-Dependent Variability and Its Impact on Embedded System Design. In 13th IEEE International On-Line Testing Symposium, p. 121.

Reese, R. et al. 2005. A Fine-Grain Phased Logic CPU. In Proceedings of the IEEE Computer Society Annual Symposium on VLSI, Feb. 2003, pp. 70-79.

Reese, R. et al. A Coarse-Grain Phased Logic CPU. IEEE Transactions on Computers, Jul. 2005, vol. 54, No. 7, pp. 788-799.

Singh, M. et al. 2000. Fine-Grain Pipelined Asynchronous Adders for High-Sped DSP Applications. In Proceedings of the IEEE Computer Society Annual Workshop on VLSI, 8 pages.

Smirnov, A. et al. 2004. Gate Transfer Level Synthesis as an Automated Approach to Fine-Grain Pipelining. In Workshop on Token Based Computing (ToBaCo), Jun. 22, 2004, pp. 67-77.

Smirnov, A. et al. 2005. An Automated Fine-Grain Pipelining Using Domino Style Asynchronous Library. In Fifth International Conference on Application of Concurrency to System Design, Jun. 2005, pp. 68-76.

Thornton, M.A. et al. 2002. Generalized Early Evaluation in Self-Timed Circuits. In Proceedings of the Design, Automation and Test in Europe, pp. 255-259.

Tiwari, V. et al. 1998. Guarded Evaluation: Pushing Power Management to Logic Synthesis/Design. IEEE Transactions on Computer-Aided Design of Integrated Circuits and Systems, Oct. 1998 vol. 17, No. 10, pp. 1051-1060.

International Search Report for PCT Application Serial No. PCT/US09/40196, mailed on Jun. 8, 2009.

\* cited by examiner

Token Filter

```
module TF          (L, EN, R);
       `INPORT         (L,1)
       `INPORT         (En,1)
       `OUTPORT        (R,1)
       reg             d, en;
       always
       begin
              `RECEIVE(En, en);
              `RECEIVE(L, d);
              If (en==`UPDATE)
              begin
                    `SEND(R,d)
              end
       end
endmodule
```

Listing - VerilogCSP Description of Token Filter (TF) Module

Token Latch

```
module TL         (L, EN, R);
      `INPORT           (L,1)
      `INPORT           (EN,1)
      `OUTPORT          (R,1)
      reg               d, en;
      always
      begin
            `RECEIVE(EN, en);
            If (en==`UPDATE)
                  `RECEIVE(L,d);
            `SEND(R,d);
      end
endmodule
```

Listing - VerilogCSP Description of Token Latch (TL) Module

FIG. 6

```
module GeneralAsyncModule  (L, R);
      `INPORT           (L,1);
      `OUTPORT          (R,1);
      parameter  FL = 2;     //forward latency
      parameter  BL = 8;     //backward latency
      reg              inValue, outValue;
      always
      begin
           `RECEIVE(L,inValue);
           #FL;
           outValue=F(inValue);  //Computation
           `SEND(R,outValue)
           #BL;
      end
endmodule
```

High level description of an asynchronous module in VerilogCSP

FIG. 7

```
module TokBuf         (L, R);
      `INPORT           (L,1);
      `INPORT           (Reset,1);
      `OUTPORT          (R,1);
      parameter  INIT_VALUE = 0; //Initial Value
      parameter  FL = 2;         //forward latency
      parameter  BL = 8;         //backward latency
      reg              inValue, outValue, r;
      initial
      begin
           `SEND(R, INIT_VALUE);
      end
      always
      begin
           `RECEIVE(L,inValue);
           #FL;
           outValue=inValue;
           `SEND(R,outValue);
           #BL;
      end
endmodule
```

VerilogCSP description of TokBuf module which sends an initial token upon reset

```
OriginalConversion(SynchronousGraph G1){
      FindEnableSetsAndDomains(G1);
      G1 = RemoveClockNetwork(G1);
      G2 = new AsynchronousGraph;
      for (each unvisited vertex v in G1.v){
            G2.V.Add(v);
            Convert(G1,G2,v);
      }
      InsntantiateExtraEnableSetLogic();
      ConnectEnableSignalsToTLandTFModules();
      Return G2
}
Convert(GSync, GAsync, v){
      for (each unvisited u ∈ FanOut(v)){
            GAsync.V.Add(u);        //Copy u to the GAsync
            if(ES(v)==ES(u))        //v,u ∈ same enable domain
                  GAsync.E.Add(v,u);
            else                    //Crossing enable domains
                  InstantiateAndConnectTLandTF(v,u,ES(v),ES(u));
            Convert(GSync, GAsync, u);
      }
}
```

Algorithm for original conversion of the synchronous to an asynchronous graph

```
MergingEnableDomains(GAsync, S){
      MP:{(u,v,P_before,P_after)} = {};//Merging Pairs
      BreadthFirstCalculatePowBeforePowAfter(GAsync,S,MP);
      While (P_after > P_before for any mp in MP){
            find mp_i ∈ MP with MAX(mp_i.P_after - mp_i.P_before)
            mergeDomain = MergePairs(mp_i);
            //Update MP
            in = {(u,v,P_before,P_after)∈MP, where u=mergeDomain};
            out= {(u,v,P_before,P_after)∈MP, where v=mergeDomain};
            MP = MP - (in ∪ out);
            newIn = CalculatePowBeforePowAfter(in,mergeDomain);
            newOut = CalculatePowBeforePowAfter(mergeDomain,out);
            MP = MP ∪ newIn ∪ newOut;
      }
}
```

Pseudo code for merging enable domains

Enable domain and boundary cells

Two sample enable domains

Merged enable domains

Two enable domains fanning into another enable domain

POWER AWARE ASYNCHRONOUS CIRCUITS

RELATED APPLICATION

This application claims the benefit of U.S. Provisional Patent Application Ser. No. 61/043,988, filed Apr. 10, 2008 and entitled "Gated Multi-Level Domino Template", the entire contents of which are incorporated herein by reference.

BACKGROUND

It has been shown that asynchronous circuits can improve the throughput of a circuit, and can be more robust to process variability and environmental changes. This can potentially allow designers to use asynchronous circuits in ASIC design flows. The omission of the clock network together with the fact that asynchronous circuits can be active only when they are performing useful functions, can inherently contribute to the reduction of switching activity, and hence power saving. These benefits, however, come at the expense of incorporating handshaking signals, completion detection trees, distributed controllers, and timing assumptions. The extra overhead might lead to a circuit with more area and higher power consumption compared to synchronous implementation.

Therefore, designers of low power asynchronous circuits typically endeavor to carefully avoid intensive overhead to be able to compete with the equivalent synchronous implementation.

Because of the more complicated structure of asynchronous circuits, they have not been adopted by commercial computer-aided design ("CAD") tool developer companies as much as synchronous circuits have been. Thus, a circuit designer does not have a wide range of options when it comes to design automation of asynchronous circuits.

This has motivated many asynchronous designers to exploit synchronous CAD tools for synthesizing asynchronous circuits. There are multiple instances in the literature that designers tried to use a familiar synchronous design flow for an asynchronous flow and feel the gaps with rather simple ad-hoc algorithms in order to build up an asynchronous circuit design flow. Often, the original legacy circuit is described at a synchronous register transfer level ("RTL") level as a netlist, or interconnection or interconnectivity of primitive circuit elements or electronic design. Netlists usually convey connectivity information and at a basic level provide nothing more than instances, nets, and perhaps some attributes.

Various approaches exist for starting with a synchronous netlist to produce an asynchronous netlist. The following are significant examples of such approaches:

A De-synchronization approach has been used, as described by J. Cortadell, et al. "Desynchronization: Synthesis of Asynchronous Circuits From Synchronous Specifications," Computer-Aided Design of Integrated Circuits and Systems, IEEE Transactions on. Volume 25, Issue 10, pp. 1904-1921 (October 2006). In this method, each flip-flop is converted into two latches: an odd and an even latch. The clock tree is then replaced by a set of handshaking signals. Asynchronous local controllers are added to the netlist to enable the latches and control the flow of data so that the flow of data in the asynchronous netlist is equivalent to the flow of data in the asynchronous netlist.

A phased logic approach is described in D. H. Linder, et al. "Phased logic: supporting the synchronous design paradigm with delay-insensitive circuitry," Mississippi State Univ., IEEE Transactions, vol. 45, issue 9, pp. 1031-1044 (September 1996). In this method the modules in the synchronous netlist are replaced by equivalent phased logic modules. In phased logic, each signal is encoded with two Level Encoded Dual Rail ("LEDR") signals. After the original conversion, the liveness and safeness problems are analyzed and extra buffers and token-buffers are added if necessary. Although some FPGA implementations of this technique have been reported, in general custom LEDR library development is needed.

A null convention logic approach is described in Karl M. Fant, et al. "NULL Convention Logic" (Theseus Logic, Inc.), and available at http://www.cs.ucsc.edu/~sbrandt/papers/NCL2.pdf. This method starts from conventional HDL. It then gets synthesized into an intermediate library called 3NCL. This library is still a single-rail library but with the addition of an extra possible value (the NULL value) for all wires. This preserves single-rail simulation and design capabilities, while emulating the final dual-rail gates. The final library is a full dual-rail library. Next, second run of synthesis is performed to translate the 3NCL gates into 2NCL gates that are the true dual-rail gates that will be used for the physical design process. In order to assure DI behavior only a limited variety of gates are used (2-input NAND, NOR, XOR).

Another approach is described in A. Smirnov, et al. "Synthesizing Asynchronous Micropipelines with Design Compiler," Proc. SNUG Boston 2006: Synopsys User Group, Sep. 18-19, 2006, Boston, USA. In this method, a synchronous circuit described at RTL level is implemented as an asynchronous micropipeline. Synthesis can be targeted at a wide range of micropipeline protocols and implementations through standard cell library approach. Primary target applications include high-throughput low-power using domino-like low-latency cells.

A dataflow graph approach is described in International Patent Application No. PCT/US2007/067618 (Publication No. WO/2007/127914) and entitled "Systems And Methods For Performing Automated Conversion Of Representations Of Synchronous Circuit Designs To And From Representations Of Asynchronous Circuit Designs" having Applicant Achronix Semiconductor Corp. and inventor R. Manohar. In this method a synchronous netlist containing combinational logic, latches, and flip flops with multiple clock domains and enable signals is converted to asynchronous circuit using a notion of dataflow graph. This method eliminates the gating through substitution of a MUX transformation and using the gating information to make the output of the state-holding element a conditional signal. In such a method, if the state holding element in synchronous circuit is gated, either the gating is eliminated using a MUX, or the previous token will be generated using an asynchronous register module. Hence, the computational modules will be activated and consume a token whose value is the same as the previous token.

Another approach is described in U.S. Provisional Patent Application Ser. No. 61/047,714, filed 24 Apr. 2008 and entitled "Clustering and Fanout Optimizations of Asynchronous Circuits" to G. Dimou (and assigned to the assignee of the present disclosure), the entire contents of which are incorporated herein by reference.

For such an approach, a synchronous netlist of combinational gates and flip-flops can be converted to asynchronous templates, such as a pre-charged half-buffer ("PCHB"), e.g., as described in "Pipelined Asynchronous Circuits" by Lines, Andrew Matthew (1998), Technical Report, California Institute of Technology, [CaltechCSTR:1998.cs-tr-95-21]. In such an approach, the netlist is first clustered into several gates that can use a shared controller, subject to a given cycle time constrain. The cluster size is limited by the number of inputs and output. After clustering, the tool tries to optimize the throughput of the circuit through slack matching and minimize the area.

SUMMARY

Aspects and embodiments of the present disclosure can provide asynchronous techniques for RTL design to provide asynchronous RTL designs that are comparable or equivalent to given synchronous RTL designs while achieving lower power consumption, faster throughput, or both. Embodiments of the present disclosure accept a synchronous RTL netlist with clock gating elements as an input and output an asynchronous power optimized netlist, described at a high level of description that can be implemented using wide range of asynchronous templates.

Exemplary embodiments of the present disclosure provide methods for conversion of a synchronous netlist, e.g., of combinational modules, flip flops (or latches), and clock gating modules, to a netlist of asynchronous modules. The processes (including algorithms) described herein can operate to bundle multiple modules in an enable domain, so that they are activated only if the incoming enable token to the enable domain has an UPDATE value. Further, the modules can be clustered inside an enable domain, so that each cluster has a separate controller. The objective function of bundling and clustering can function to minimize power consumption with respect to a given cycle time.

It should be understood that while certain embodiments/aspects are described herein, other embodiments/aspects according to the present disclosure will become readily apparent to those skilled in the art from the following detailed description, wherein exemplary embodiments are shown and described by way of illustration.

The techniques and algorithms are capable of other and different embodiments, and details of such are capable of modification in various other respects. Accordingly, the drawings and detailed description are to be regarded as illustrative in nature and not as restrictive.

BRIEF DESCRIPTIONS OF THE DRAWINGS

Aspects and embodiments of the present disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 6 depicts an example of a high level description of an asynchronous module in VerilogCSP, in accordance with exemplary embodiments of the present disclosure;

FIG. 7 depicts an example of a high level description of a token buffer module in VerilogCSP, in accordance with exemplary embodiments of the present disclosure;

FIG. 8 depicts an example of a high level description of an algorithm for original conversion of a synchronous graph to an asynchronous graph in VerilogCSP, in accordance with exemplary embodiments of the present disclosure;

FIG. 17 depicts a listing of pseudo code for merging enable domains, in VerilogCSP, in accordance with exemplary embodiments of the present disclosure.

Figures 1, 2:
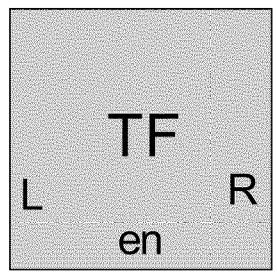
FIG. 1 depicts a diagrammatic view of token filter module, in accordance with exemplary embodiments of the present disclosure.
FIG. 2 depicts a listing of a VerilogCSP description of a token filter module, in accordance with exemplary embodiments of the present disclosure.

While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

As described previously, the present disclosure provides for methods, including specific algorithms, for conversion of a synchronous netlists, e.g., of combinational modules, flip flops (or latches), and clock gating modules, to netlists of asynchronous modules. Techniques including algorithms described herein can utilize token filters and token latches, and can function to bundle multiple modules in an enable domain, so that they are activated only if an incoming enable token to the enable domain has an UPDATE value. The modules can be clustered inside an enable domain, so that each cluster has a separate controller. The objective function of bundling and clustering can minimize power consumption with respect to a given cycle time.

Some alternate approaches (e.g., as described previously) do not start from an synchronous netlist where clock-gating modules are present. For such alternate approaches, if the state holding element in synchronous circuit is gated, either the gating is eliminated using a MUX, or the previous token will be generated using an asynchronous register module. Hence, the computational modules will be activated and consume a token whose value is the same as the previous token. For embodiments of the present disclosure, in contrast, in the equivalent asynchronous circuit no token will be sent to the computational modules at the fan-out cone of the state holding elements. If the state-holding element is gated, the incoming token will be filtered out, using a token filter module. Hence, the computational modules will not be activated anymore. In this way, embodiments of the present disclosure can avoid activating computational modules with a token that has the previous value.

Figure 5:
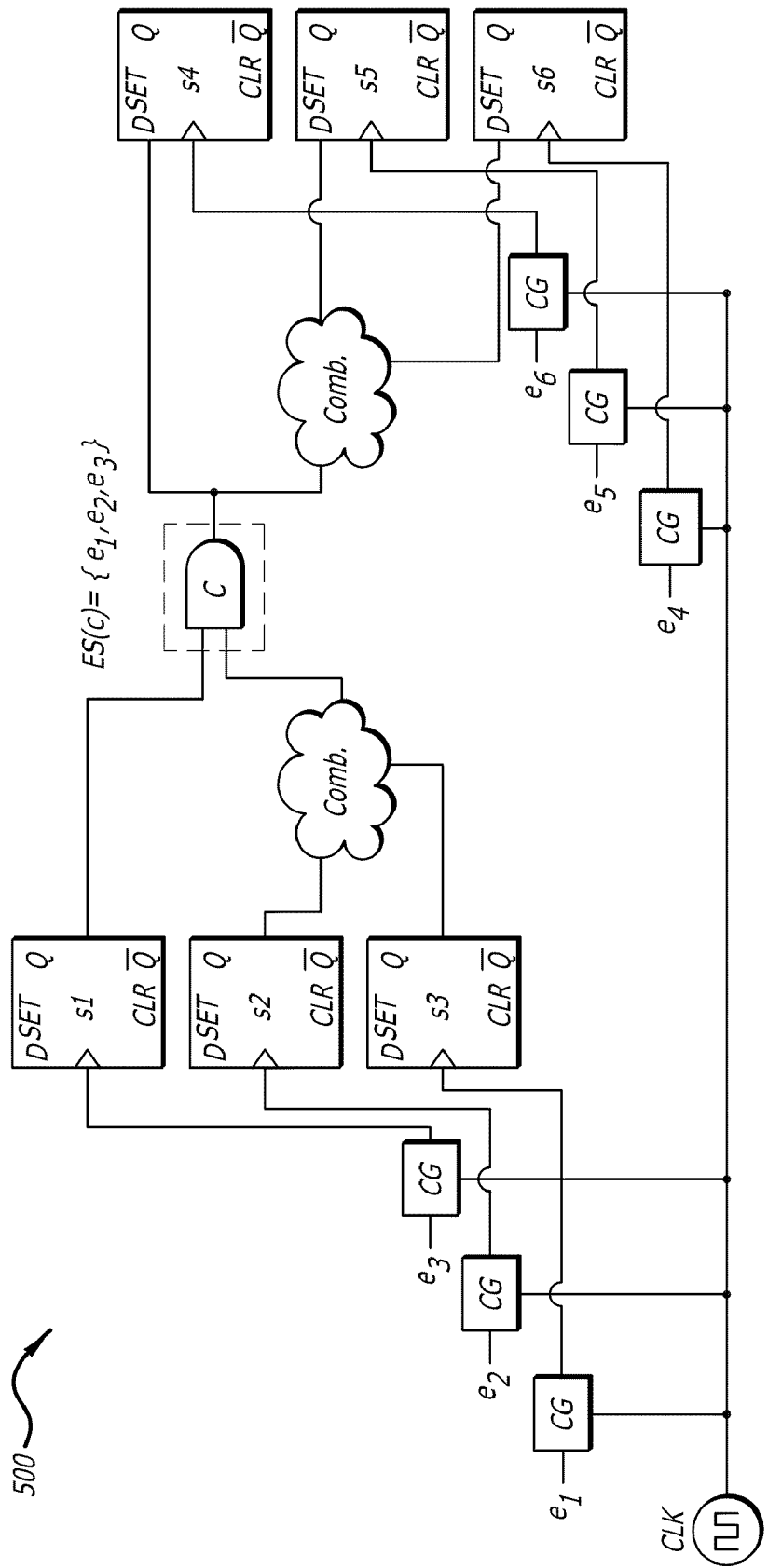
FIG. 5 depicts an example of an enable set for a combinational gate, in accordance with exemplary embodiments of the present disclosure.

While some techniques for handling clock gating circuitry are presented in alternate approaches (e.g., as described previously) where conditional split and join modules are used to bypass the disabled part of the circuit and to avoid deadlock and starvation, techniques/algorithms of the present disclosure differ from those alternate approaches in the sense that for each combinational gate a notion of an enable set is introduced, e.g. as shown in FIG. 5, which then translates to when exactly the gate is not needed and can safely be turned off. A gate with multiple inputs having different transitive fan-in state holding elements with different enable signals should (can) be turned off only if all the enable signals are low. These enable signals can construct the enable set of the gate. To implement enable sets, extra logic can be instantiated to execute logical OR operation on original enable signals. This can provide a greater opportunity to disable gates that are not active, and hence save power. The OR logic is added only when the power saving justifies the overhead of the extra circuitry Moreover, algorithms are described herein, which can be used to combine enable domains and instantiate less boundary (TF and TL modules described in Token Filter and Token Latch sections as follows) modules. Further optimization is described for enable tokens, which can be qualified with the previous fan-in enable domains as explained in subsequent section "Further Optimization of Enable Tokens." Accordingly, if fan-in enable domains of an enable domain are not producing a new token, the enable domain does not get activated. Clustering methods/algorithms of the present disclosure can include the ability of clustering synchronous netlist with clock gating modules. In addition, such methods/algorithms can explicitly define the objective function of the conversion to be power consumption.

The output of embodiments of the present disclosure can be in the form of a netlist or hardware description language of asynchronous modules, e.g., described in high level VerilogCSP language. Therefore, any asynchronous template that is able to implement such a netlist or hardware description language, e.g., VerilogCSP descriptions, can be used as the low-level implementation. Such an output can be used as an input to circuit design and/or simulation software, firmware, and/or hardware, including apparatus and/or systems suitable for application specific integrated circuit ("ASIC") design and/or manufacturing, including chip circuit layout and fabrication/lithography.

Moreover, embodiments of the present disclosure can be utilized, implemented with, or stored in computer-readable storage media, including commercially available storage media including but not limited to CDs, DVDs, hard drives, flash memory, tape media (both optical and magnetic), and the like. It will be appreciated that embodiments of the present disclosure are not limited to specific types of signal/instruction storage media and will have increased utility as new types of storage media are developed. It should be appreciated that algorithms/methods according to the present disclosure can function or run on one or more suitable computer systems, e.g., those with suitable memory, processing, and/or I/O (e.g., display) functionality. It will be appreciated that embodiments of the present disclosure are not necessarily limited to specific types of computer systems and can have increased utility as new types of computer systems are developed.

Model for Exemplary Embodiments

This section provides an explanation and description of the mathematical models/algorithms used for exemplary embodiments. Two novel asynchronous modules are presented for reducing token flow in a circuit, and hence saving power. Additionally, a definition is given for a novel notion called enable domains.

Conditional Token Flow Regulator Modules

In order to regulate and minimize the flow of tokens, two modules, described in a suitable language or script, e.g., VerilogCSP, are introduced: a token filter and a token latch. These modules can use conditional communication actions, as is explained in further detail in the following sections.

Token Filter:

An example 100 of token filter module is shown in FIG. 1. Module 100 can be configured to always receive a token on input channels L and EN. Then, based on the value received on EN, it may or may not send a token on the output channel R. Hence, it filters out the received tokens from the input based on the value received on EN. FIG. 2 shows a description 200 of this module 100.

Figures 3, 4:
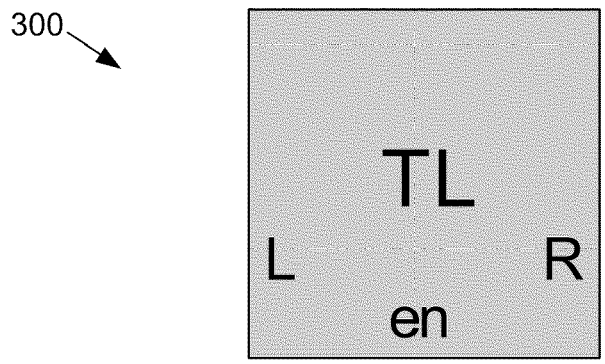
FIG. 3 depicts a diagrammatic view of token latch, in accordance with exemplary embodiments of the present disclosure.
FIG. 4 depicts a listing of a VerilogCSP description of a token latch module, in accordance with exemplary embodiments of the present disclosure.

Token Latch:

An example 300 of a token latch module according to the present disclosure is shown in FIG. 3. Token latch module 300 can first receive a token on EN channel. If the value received from L is 'UPDATE, module 300 can receive a value on the L channel and update the value of internal variable d with the new value. Finally, it sends the value of the internal state variable d to the output channel R.

Module 300 was originally referenced as a Token Latch since if en value is 'UPDATE, similar to a transparent latch, it operates to let an input token pass through the latch to the output channel.

On the other hand, when the en value is 'NOUPDATE, similar to an opaque latch, the module 300 operates to send the previous stored value to the output channel. FIG. 4 shows a description 400 of this module 300 in VerilogCSP.

Input Synchronous Graph

For exemplary embodiments, a given input synchronous circuit can be mapped to a directed graph as follows:

$$G_1 = (V_s, E_s)$$

$$V_s = PI \cup PO \cup C_s \cup S_s \cup G_s \cup CLK$$

$$E_s = D_s \cup EN_I \cup EN_O \cup CLKNET$$

$$A: EN_I \to [0, +\infty]$$

$$PW: C_s \cup S_s \to [0, +\infty]$$

Where PI=Primary Input, PO=Primary Output; $C_s$=Combinational Gates; $S_s$=Sequential Gates; $G_s$=Clock Gating Element; CLK=Clock network drivers; A=Activity Factor; PW=Switching power of the gate in watts; $D_s=\{(u,v) | u, v \in C_s \cup S_s \cup PI \cup PO\}$, edges between sequential gates, combinational gates, primary inputs, and primary outputs; $EN_I := \{(u, v) | v \in G_s\}$, incoming edges to clock gating elements; $EN_O := \{(u, v) | u \in G_s\}$, outgoing edges from clock gating elements, and CLKNET=$\{(u,v) | (u \in CLK \cup G_s) \vee (v \in CLK \cup G_s)\}$, edges in the clock network.

For the preceding graph, a further definition can be given:
1. Path from u to v, $p_{u,v}$: define $p_{u,v}$ to be a path between vertices u and v where:

$$p_{u,v} \subset 2^{V_s}$$

$$\forall i < |p_{u,v}|: (p_{u,v}[i], p_{u,v}[i+1]) \in E_s$$

Thus, $p_{u,v}$ is a tuple, and $p_{u,v}[k]$ is the $k^{th}$ element of the tuple.

2. Set of all paths $P_0$: $P_s = \{p_{u,v}|u, v \in V_s\}$
3. Sequential Fan In (SFI):
  a. for a combinational gate $c \in C_s$, SFI(c) can be defined as follows:

$$SFI(c) = \{s_i \subset S_s | (\exists p_{s_i,c} \in P) \wedge (\neg \exists k \neq i: p_{s_i,c}[k] \in S_s)\}$$

b. for a sequential gate $s \in S_s$, SFI(c) is defined as follows $$SFI(s) = \{s\}$$

4. Enable Set (ES):
  a. For a sequential gate s, the enable set is defined as:

$$ES(s) = \{e \in EN_1 | (e = (v,g)) \wedge ((g,s) \in EN_o) \wedge (v \in V_s) \wedge (g \in G_s)\}$$

b. For a combinational gate c, the enable set is defined as:

$$ES(c) = \left\{ \bigcup_i e_i \,\middle|\, (e_i \in ES(s_i)) \wedge (s_i \in SFI(c)) \right\}$$

5. Always Enable Set (AES): If for a vertex $c \in C_s$, ES(c) is empty, ES(c) is called Always Enable Set, or AES for short.

6. Enable Domain (ED): For a node $v \in C_s \cup S_s$, Enable Domain of v, ED(v) is defined as:

$$ED(v) = \left\{ \bigcup_{u \in C_s \cup V_s} u \,\middle|\, ES(u) = ES(v) \right\}$$

7. Always Enable Domain (AED): For a set of nodes $c_i \in C_s$, Always Enable Domain is defined as:

$$AED = \left\{ \bigcup_i c_i \,\middle|\, ES(c_i) = \varnothing = AES \right\}$$

FIG. 5 shows an example 500 of an enable set for a combinational gate c. FIG. 5 illustrates that a given circuit can be partitioned into disjoint enable domains.

Output Asynchronous Graph

To convert a given synchronous graph to a new graph $G_2(V_a, E_a)$ consisting of asynchronous modules, $G_2$ can be defined as follows:

$$V_a = PI \cup PO \cup C_a \cup S_a \cup TF \cup TL$$

$$E_a = D_a \cup EN_a$$

Where PI=Primary Input; PO=Primary Output; $C_a$=Asynchronous Computational Modules; $S_a$=TokBuf Modules; TF=Token Filter modules, e.g., as described in FIG. 2; TL=Token Latch modules, e.g., as described for FIG. 4; $D_a = \{(u,v)|u, v \in C_a \cup S_a \cup PI \cup PO\}$, edges between computational modules, primary inputs, and primary outputs; and, $EN_a = \{(u, v)|(v \in TF) \vee (v \in TL)\}$, incoming edges to TL or TF modules.

Similar to the synchronous graph, on the asynchronous graph $G_2$, the following definitions can be made:

1. Path from u to v $p_{u,v}$: $p_{u,v}$ can be defined to be a path between vertices u and v where:

$$p_{u,v} \subset 2^{V_a}$$

$$\forall i < |p_{u,v}|: (p_{u,v}[i], p_{u,v}[i+1]) \in E_a$$

Thus, $p_{u,v}$ is a tuple, and $p_{u,v}[k]$ is the $k^{th}$ element of the tuple.

2. Set of all paths $P_a$: $P_a = \{p_{u,v}|u, v \in V_a\}$
3. Fan-in: for a vertex $v \in C_a \cup S_a \cup TF \cup TL \cup PO$, Fan-in, FI(v), is defined as the number of incoming edges to v.
4. Fan-out: for a vertex $v \in C_a \cup S_a \cup TF \cup TL \cup PI$, Fan-in, FO(v), is defined as the number of outgoing edges from v
5. Token Filter Fan In:
  a. For a vertex $u \in C_a \cup S_a \cup TF \cup PO$, TFFI(u) can be defined as follows:

$$TFFI(u) = \{tf_i \subset TF | (\exists p_{tf_i,u} \in P_a) \wedge (\neg \exists k \neq i: p_{tf_i,u}[k] \in TF)\}$$

b. for a Token Filter gate $tf \in TF$, TFFI(tf) is defined as follows:

$$TFFI(tf) = \{tf\}$$

6. Token Latch Fan Out:
  a. For a vertex $u \in C_a \cup S_a \cup TL \cup PI$, TLFO(c) can be defined as follows $$TLFO(u) = \{tl_i \subset TL | (\exists p_{u,tl_i} \in P_a) \wedge (\neg \exists k \neq i: p_{u,tl_i}[k] \in TL)\}$$

b. for a Token latch gate $tl \in TL$, TLFO(tl) can be defined as follows TLFO(tl)=tl
7. Enable Set:
  a. For a vertex $t \in TF \cup TL$, the enable set is defined as:

$$ES(t) = \{e \in EN_a | e = (v,t)\}$$

b. For a vertex $c \in u \in C_a \cup S_a \cup PI \cup PO$, the enable set can be defined as:

$$ES(c) = \{e_i | (e_i \in ES(t_i)) \wedge (t_i \in TFFI(c))\}$$

8. Always Enable Set (AES): If for a vertex $v \in V_a$, ES(v) is empty, ES(v) is called Always Enable Set, or AES for short.
9. Enable Domain: For a node $v \in V_a$, Enable Domain of v, ED(v) is defined as:

$$ED(v) = \left\{ \bigcup_u u \,\middle|\, ES(u) = ES(v) \right\}$$

10. Always Enable Domain (AED): For a set of nodes $v_i \in V_a$, Always Enable Domain is defined as:

$$AED = \left\{ \bigcup_i v_i \,\middle|\, ES(v_i) = \varnothing = AES \right\}$$

11. Activity factor: For an enable domain ed, activity factor A(ed) is defined as follows:

$$A: 2^{ES} \to [0, 1]$$

$$A(ed) = \text{Probability} \begin{pmatrix} en \text{ inputs of } TL \text{ and} \\ TF \text{ modules in } ed = \\ \text{'UPDATE'} \end{pmatrix}$$

$$= 1 - \text{Probability} \begin{pmatrix} en \text{ inputs of } TF \text{ and} \\ TL \text{ modules in } ed = \\ \text{`NOUPDATE} \end{pmatrix}$$

12. Power Per Token:
  a. For a module $v \in C_s \cup S_s$, Power Per Token (PPT) is defined as:

$$PPT : C_A \cup S_A \rightarrow [0, +\infty]$$

$PPT(v)$ = Power consumed for receiving a token from input +

Computation + Sending the token to the output b. For a module $t \in TF \cup TL$, Power Per Token (PPT) is defined as:

$$PPT : TL \cup TF \rightarrow [0, +\infty]$$

$$PPT(t) = \frac{1}{2}(P_{Update}(t) + P_{NoUpdate}(t))$$

$P_{Update}(t)$ = Power consumed for receiving enable token +

Receiving the token from input + Sending the token to the output $P_{NoUpdate}(t)$ = Power consumed for receiving enable token +

Receiving the token from input +

Sending the previous token to the output (if $t \in TL$)

High level description of modules: a module $v \in C_s \cup S_s$ can be modeled, e.g., using a high level description in VerilogCSP an example of which 600 is shown in FIG. 6. Each module receives a token from the input, performs a function F (which can be identity) on it, and sends the result to the output. Note that these modules can have multiple inputs (not shown in the picture). In this case, the module will wait to receive all the inputs, and then it calculates and sends the output value. In addition, some of the modules in the asynchronous circuit should generate an initial token upon reset, much like the rest value of the state holding elements in synchronous circuits. FIG. 7 shows an example 700 of a high-level description of such modules.

Forward Latency: for a module $v \in C_a \cup S_a$, Forward Latency (FL) is the time from when it starts receiving a new token from the input, calculate the output value until when it starts sending the resulting token to the output. This value is a function of the number of logic levels in a the low level implementation of the module Backward Latency: for a module $v \in C_a \cup S_a$, Backward Latency (BL) is the time from when the module starts sending until the time the module finishes communication actions on both channels L and R, so that it can start the next communication actions on them. Backward latency is a function of the number of logic levels, the fan-in and fan-out of the module.

Local Cycle Time: for a module $v \in C_a \cup S_a$, Local Cycle Time (LCT) is the time it takes for complete communication actions on both L and R channels, plus the time for computation of the value of the output token. The following can consequently be written: LCT(v)=FL(v)+BL(v).

Algorithms

In this section, explanation is provided about how to generate the graph $G_2$ define in previously, from graph $G_1$.

Converting the Synchronous Graph to Asynchronous Graph

The conversion of $G_1$ to $G_2$ (e.g., in FIG. 8) can be based on a depth-first-search traversing of the graph. FIG. 8 shows an example 800 of pseudo code for this algorithm, similar to a breadth-first-search algorithm.

In this algorithm, e.g., 800, first the clock network is removed from $G_1$, and enable sets and enable domains are specified. Then, each node from $G_1$ is copied to $G_2$. The edges are copied when the enable domains of to adjacent nodes are the same. Whenever an enable domain boundary is crossed, the function InstantiateAndConnectTLandTF instantiates a TF and TL module between enable domains. Primary inputs and primary outputs are treated in a special way: from a PI vertex to a non-PO vertex in different enable domains, only a TF module is instantiated. From a non-PI vertex to a PO vertex, only a TL module is instantiated. From a PI to a PO node, the edge from $G_1$ is copied to $G_2$ without any modification.

Since not all enable sets were present in the original synchronous graph, the algorithm instantiates extra logic to create them. Extra enable sets are unions of original enable signals. Hence, the extra logic is the logical OR of enable tokens in the asynchronous graph. This is done in the function InsntantiateExtraEnableSetLogic.

After instantiating all nodes, adding extra TL and TF modules, and adding extra enable set logic, the algorithm connects all enable signals to TF and TL modules by calling the function ConnectEnableSignalsToTLandTFModules.

Figure 9:
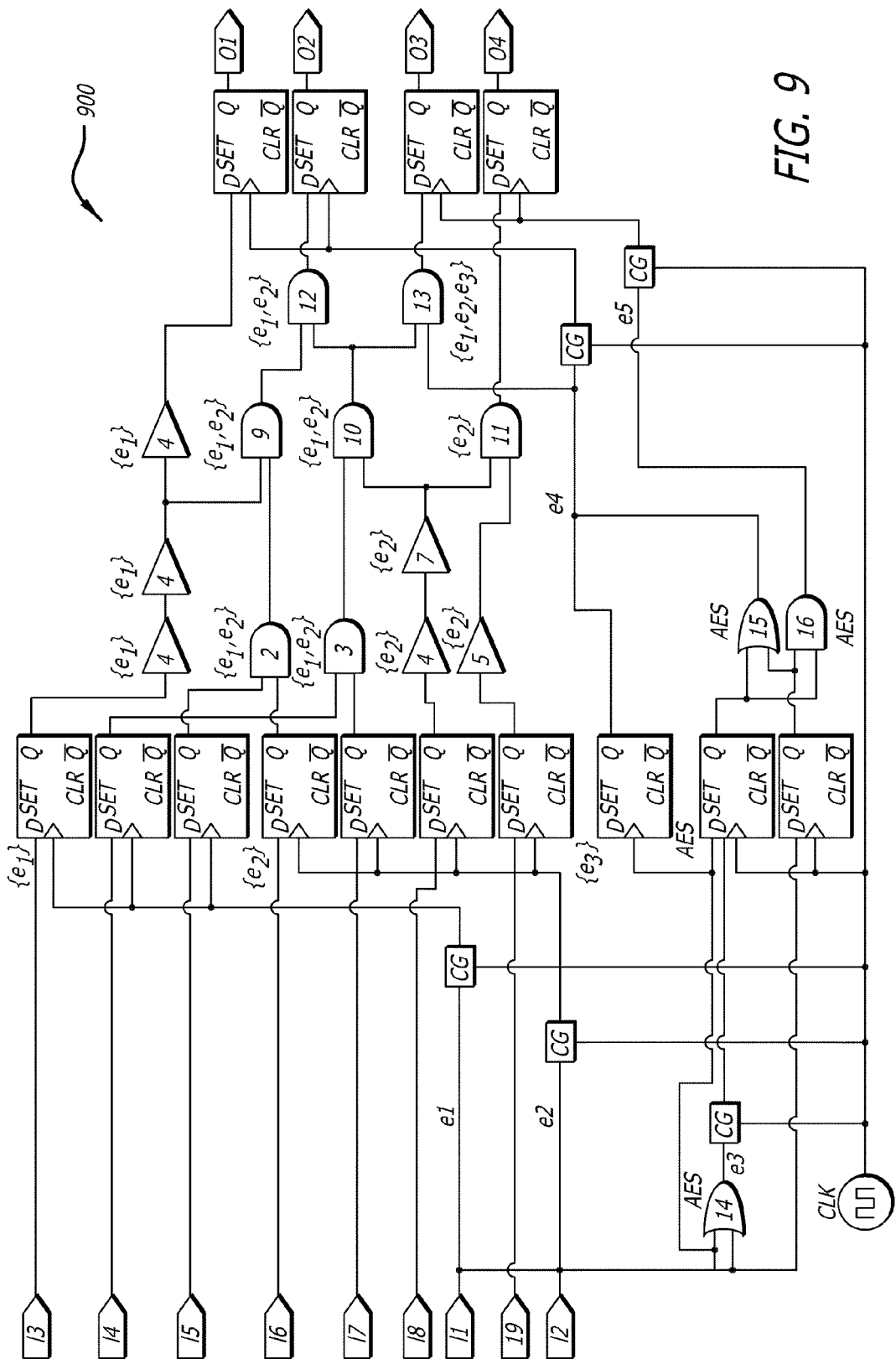
FIG. 9 depicts an example of a synchronous circuit, in accordance with exemplary embodiments of the present disclosure.
Figure 10:
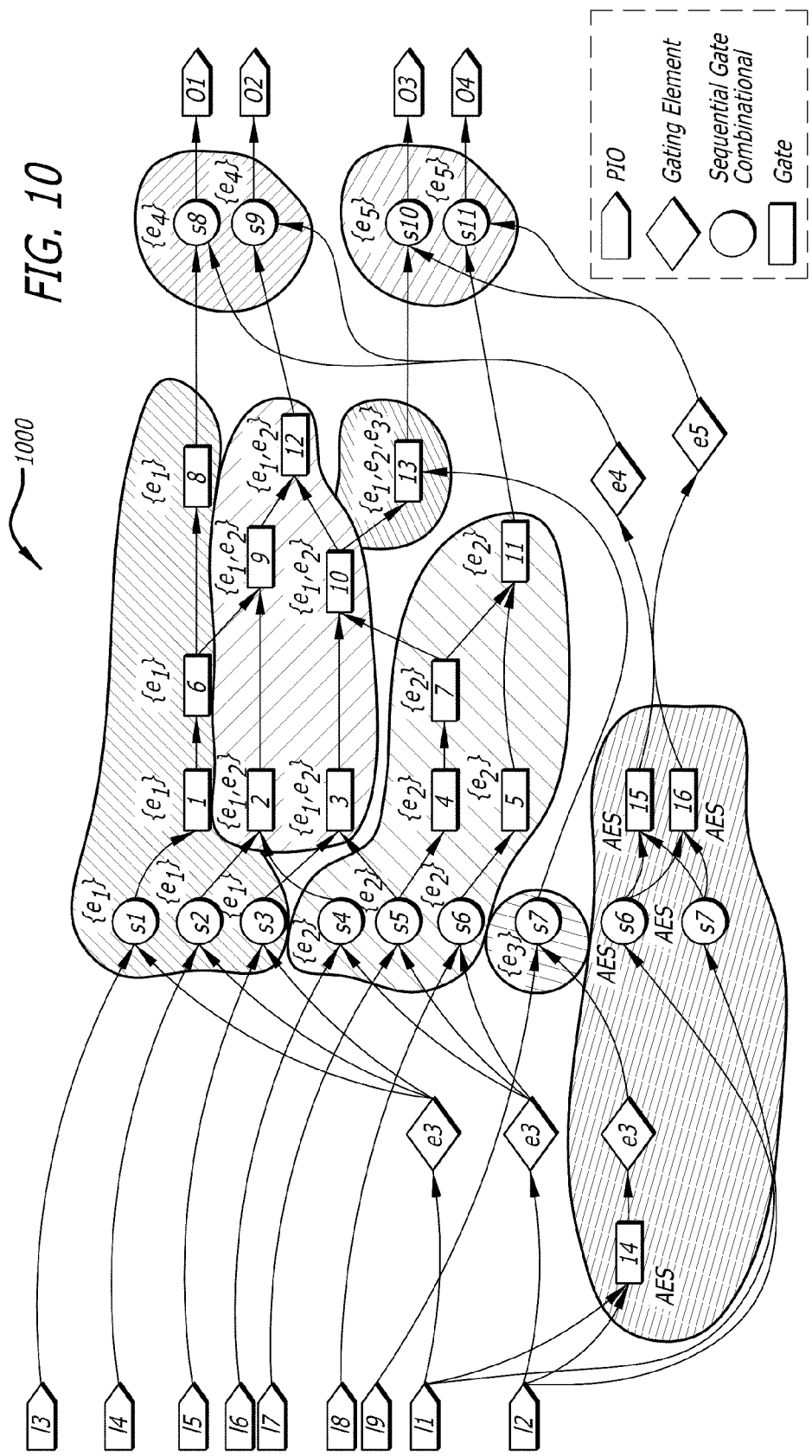
FIG. 10 depicts a graph representation of the synchronous circuit of FIG. 9.

FIG. 9 shows a sample synchronous circuit 900. Enable sets are shown for each gate. The graph representation 1000 of this circuit is shown in FIG. 10. Also, the enable domains are specified.

Figure 11:
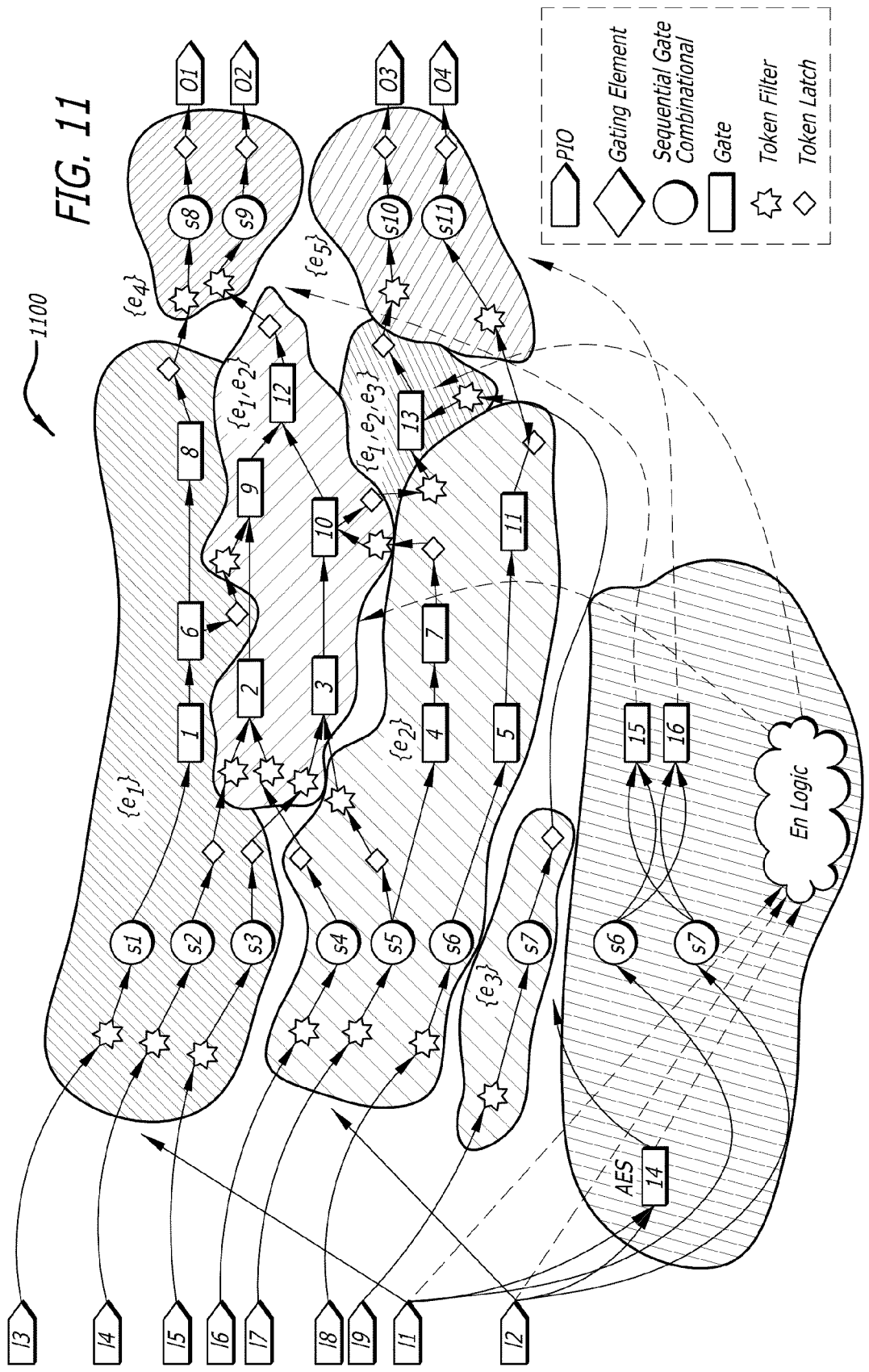
FIG. 11 depicts a graph representation of an asynchronous circuit as converted from FIG. 10, in accordance with an embodiment of the present disclosure.

FIG. 11 shows the converted asynchronous graph based 1100 on the algorithm in FIG. 8. Notice that ingoing enable edges for TF and TL modules are now shown, but instead, an ingoing edge is shown per one enable domain, which means that edge should be replicated to all TF and TL modules in a particular enable domain. Also, a new module is added, which generates enable tokens for {e1,e2} and {e1,e2,e3} domains using OR logic (where combining by an OR operator can be referred to as "ORing").

Figure 12:
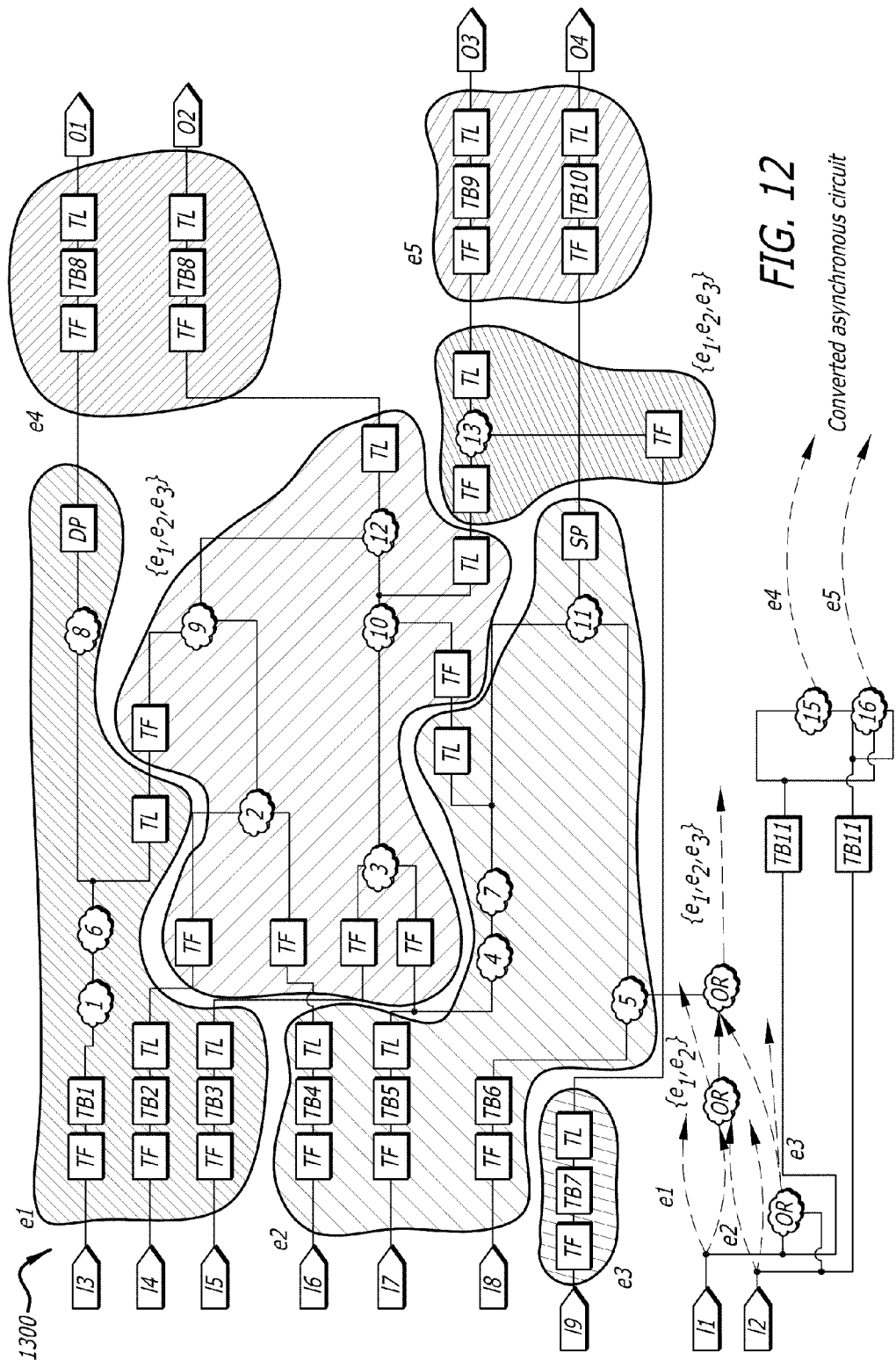
FIG. 12 depicts an asynchronous circuit corresponding to the graph of FIG. 11, in accordance with an embodiment of the present disclosure.
Figure 13:
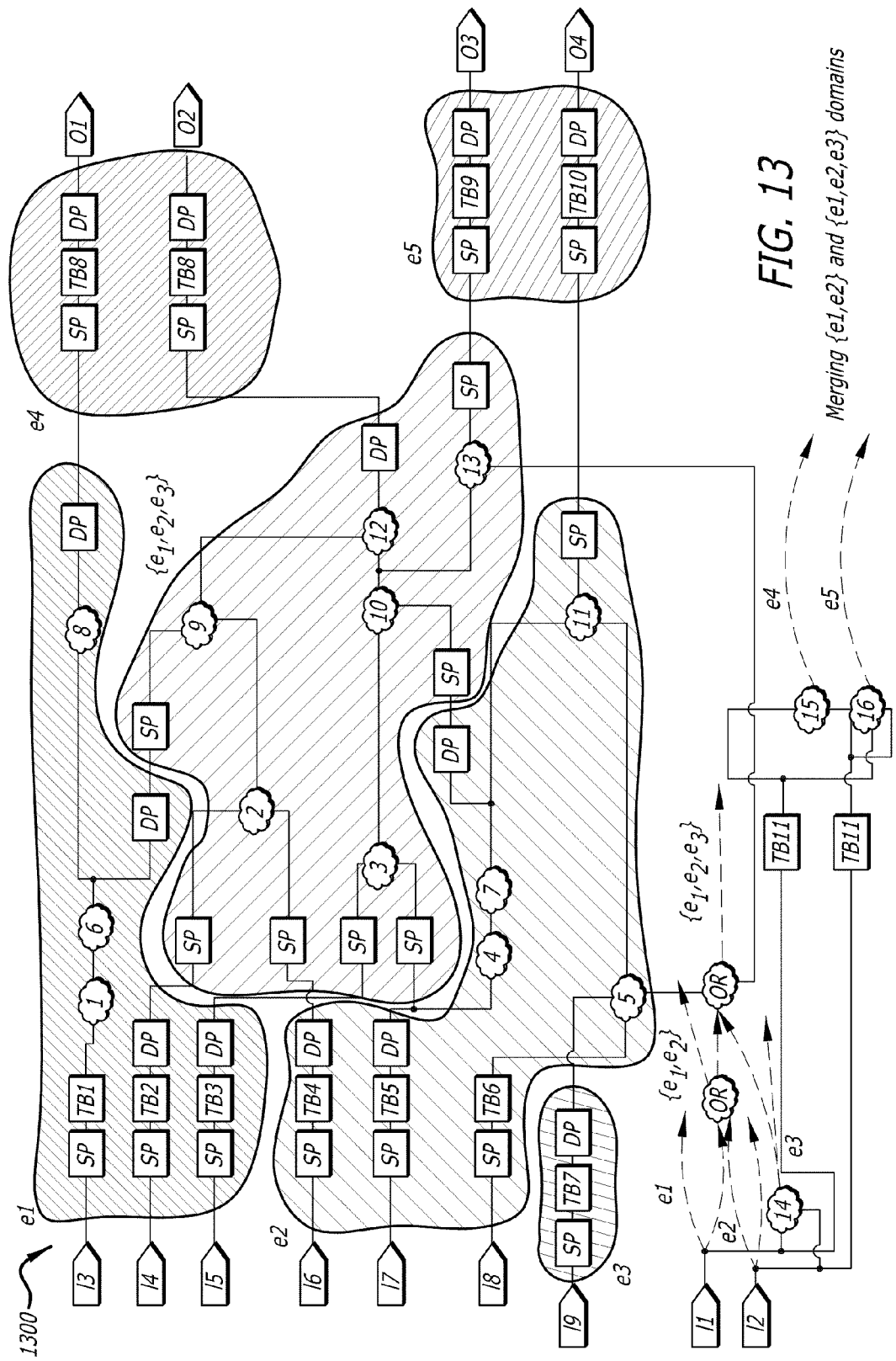
FIG. 13 depicts a graph of the merging of two domains, in accordance with exemplary embodiments of the present disclosure.

One can consider an equivalent asynchronous circuit for the converted asynchronous graph. The computational nodes can be replaced with function modules equivalent to the function modules in the synchronous graph (same truth table), and the sequential gates are replaced with TokBuf modules (TB). An example 1200 of such a circuit is shown in FIG. 12. It may be noticed that ingoing enable edge of TF and TL modules are not shown. The En Logic module is decomposed into two OR modules. Sequential modules are replaced with TB (Token Buffer) modules.

Merging Enable Domains

In the previous section, a greedy algorithm was described for use to identify enable domains. It is possible to combine enable domains and merge them. Merging enable domains can lead to some power savings since the number of boundary cells is reduced. Besides, this can facilitate a reduction the number of controllers as well, since the clustering algorithm that assigns a controller to computational blocks has the opportunity to share controllers between merging enable domains.

Example

Merging Domains

FIG. 10 shows a graph 1000 exemplifying how $\{e_1,e_2\}$ and $\{e_1,e_2,e_3\}$ domains can be merged into $\{e_1,e_2,e_3\}$ to save two TF and two TL modules and also to share the controllers of module 13 with the controller of $\{e_1,e_2\}$ domain. The trade off, of course, is that the modules in the old $\{e_1,e_2\}$ would be activated more often since they have TF and TL modules in the boundaries with $\{e_1,e_2,e_3\}$ as their incoming enable tokens. Therefore, one might do such trade-off in cases that $\{e_1,e_2\}$ is already active often, and adding $e_3$ to it would not change the activation factor that much.

To have a better understanding of such trade-offs, a power metric is introduced for each enable domain, as is described in the following section.

Power Consumption of Enable Domains

Figure 14:
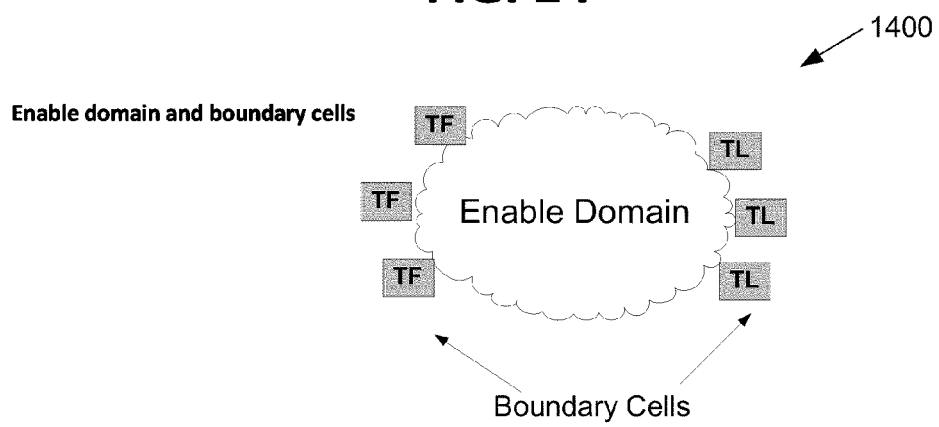
FIG. 14 depicts a graph of an enable domain and boundary cells, in accordance with exemplary embodiments of the present disclosure.

For each enable domain C, e.g., as shown by graph 1400 in FIG. 14, with activity factor $\alpha_C$, can define a power metric $P_C$, as follows:

$$P_C = \alpha_C P_C^{Active} + (1-\alpha_C) P_C^{Gated}$$

$$P_C^{Active} = P_C^{Boundary} + P_C^{Computation} + P_C^{Ctrl}$$

$$P_C^{Gated} = P_C^{Boundary}$$

$$P_C = P_C^{Boundary} + \alpha_C (P_C^{Computation} + P_C^{Ctrl})$$

Where, $P_C^{Active}$ represents the power consumption while the modules in the enable domain are active and $P_C^{Gated}$ represents the power consumption while the modules are not active. $P_C^{Boundary}$ represents the power consumption (PPT) of the boundary cells (TF and TL). $P_C^{Computation}$ represents the power consumption (PPT) of computational modules. Finally, $P_C^{Ctrl}$ represents the power consumption of the controller modules that may be needed for implementing this enable domain.

Figure 15:
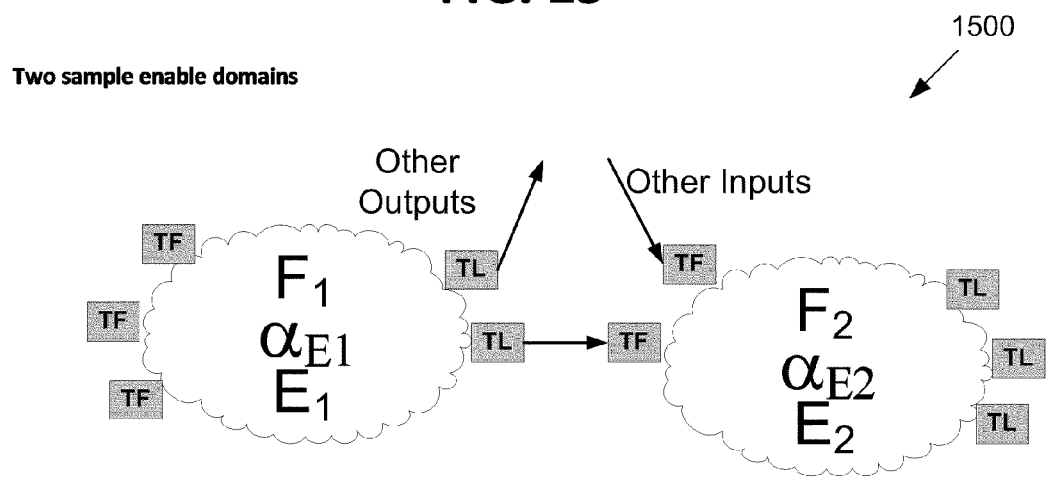
FIG. 15 depicts a graph of two sample enable domains, in accordance with exemplary embodiments of the present disclosure.

In order to merge two enable domains, the power metrics before and after merging should be calculated and compared. The next example, shows such comparison Example FIG. 15 shows two sample enable domains $E_1$ and $E_1$, with activity factors $\alpha_{E1}$ and $\alpha_{E2}$, each implementing functions $F_1$ and $F_2$.

The total power metric, $P_{Before}$, can be calculated as follows:

$$P_{Before} = P_1 + P_2$$
$$= 5P_B + \alpha_{E1}(P_{F_1} + P_{Ctrl_1}) + 5P_B + \alpha_{E2}(P_{F_2} + P_{Ctrl_2})$$
$$P_{Before} = 10P_B + \alpha_{E1}(P_{F_1} + P_{Ctrl_1}) + \alpha_{E2}(P_{F_2} + P_{Ctrl_2})$$

Where, $P_B$ represents the power metric for boundary cells (assuming they are all equal). $P_{F_1}$ and $P_{F_2}$ represent the power consumption of the computational modules in each enable domain when they are active.

Figure 16:
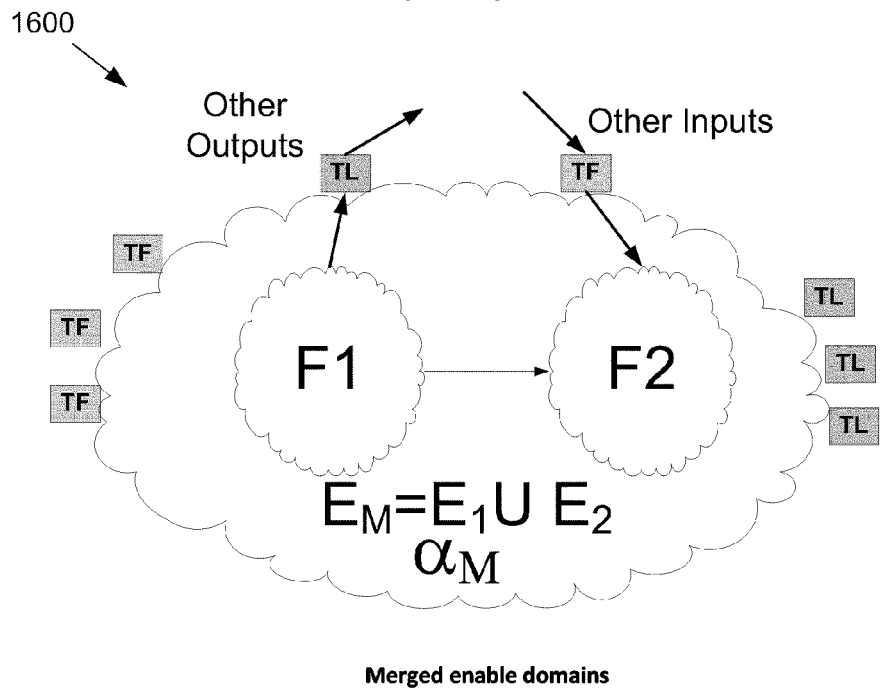
FIG. 16 depicts two merged enable domains, in accordance with exemplary embodiments of the present disclosure.

Now, if two enable domains are merged into $E_M$, as shown in FIG. 16, the power metric $P_{After}$ can be calculated as follows:

$$P_{After} = 8P_B + \alpha_M(P_{F_M} + P_{Ctrl_M})$$

Where, $P_{F_M} = P_{F_1} + P_{F_2}$

So, a calculation for $Min(P_{After}, P_{Before})$ can be made to find out if the merge pays off or not. In order to calculate Min $(P_{After}, P_{Before})$, estimates can be made of $\alpha_M$ and $P_{Ctrl_M}$.

For the activity factor, the following can be written:

$$\alpha_M = \alpha_{E_1} + \alpha_{E_2} - \alpha_{E_1 \cap E_2} \rightarrow$$
$$\begin{cases} \alpha_M = \text{Max}(\alpha_{E_1}, \alpha_{E_2}) & \text{if } E_1 \subseteq E_2 \text{ or } E_2 \subseteq E_1 \\ \alpha_M = \text{Sum}(\alpha_{E_1}, \alpha_{E_2}) & \text{if } E_1 \cap E_2 = \varnothing \end{cases}$$

$$\text{Max}(\alpha_{E_1}, \alpha_{E_2}) \leq \alpha_M \leq \text{Sum}(\alpha_{E_1}, \alpha_{E_2})$$

For the controller modules in the combined enable domain, as an estimate can be:

$$\text{Max}(P_{Ctrl_1}, P_{Ctrl_2}) \leq P_{Ctrl_M} \leq \text{Sum}(P_{Ctrl_1}, P_{Ctrl_2})$$

Now, for the purpose of this example, it can be assumed that $E_1 \subseteq E_2$ and (without loss of generality) $\alpha_{E_1} \leq \alpha_{E_2} \rightarrow \text{Max}(\alpha_{E_1}, \alpha_{E_2}) = \alpha_{E_2}$, then:

$$P_{After} = 8P_B + \alpha_M \cdot (P_{F_M} + P_{Ctrl_M})$$
$$= 8P_B + \alpha_{E_2} \cdot (P_{F_1} + P_{F_2} + P_{Ctrl_M})$$
$$\leq 8P_B + \alpha_{E_2} \cdot (P_{F_1} + P_{F_2} + P_{Ctrl_1} + P_{Ctrl_2})$$

Previously:

$$P_{Before} = 10P_B + \alpha_{E_1}(P_{F_1} + P_{Ctrl_1}) + \alpha_{E_2}(P_{F_2} + P_{Ctrl_2})$$

Now, one can compare $P_{After}$ and $P_{After}$ to accept or reject the merge.

In general, for two enable domains $E_1$ and $E_1$, with activity factors $\alpha_{E_1}$ and $\alpha_{E_2}$, number of boundary cells $b_1$ and $b_2$, number of boundary cells on shared channels $b_{12}$, implementing functions $F_1$ and $F_2$, the following can be written:

$$P_{Before} = (b_1 + b_2)P_B + \alpha_{E_1}(P_{F_1} + P_{Ctrl_1}) + \alpha_{E_2}(P_{F_2} + P_{Ctrl_2})$$

After merging, the following can be obtained:

$$P_{After} = (b_1 + b_2 - b_{12})P_B + \alpha_M(P_{F_M} + P_{Ctrl_M})$$

As shown and described for previous examples there can be many cases that the intersections of enable domains are not empty; therefore, there might be a chance to save power by merging them together. Accordingly, algorithms/modules/processes of the present disclosure can use estimates for $\alpha_M$ and $P_{Ctrl_M}$, to decide about merging enable domains optimally. To have a better estimate of $\alpha_M$, the correlations of activity factors, $\alpha_{E_i \cup E_j}$ can be used as an input to the algorithm. In cases where the controller power is not significant compared to the actual computation power, one can ignore $P_{CTRL}$ from the power metric calculations.

Merging Enable Domains: Algorithm

Based on the power metric defined in the previous section, one can define the problem as follows:

Given a graph $G_2(V_a, E_a)$, activity factor A, Power Per Token PPT, as defined previously, a set of Enable Domains S, find the best possible merging of enable domains to optimize power.

FIG. 17 shows an example 1700 of an algorithm for merging enable domains. Other suitable algorithms may be used. In this algorithm 1700, the two enable domains that result the most power saving can be merged first, then the graph can be updated based on the merge and repeat the step until there is no merge with positive power savings.

Function BreadthFirstCalculatePowBeforePowAfter traverses the graph in a breadth first search order, and whenever crosses an enable domain, it calculates the power before and after the merge of those two enable domains. The function CalculatePowBeforePowAfter calculates the power metric for two enable domains before and after the merge. Extensions that use this cost function in conjunction with simulated-annealing, genetic algorithm, or other look-ahead algorithm can be utilized within the scope of the present disclosure. Alternatives with classical statistical pattern recognition and/or a neural network and/or other heuristics are also possible.

With continued reference to FIG. 17, it can be noticed that an enable domain can be merged with Always Enable Domain as well. For those cases, in addition to the cost of the boundary cells, the cost of extra OR logic can be calculated to implement the enable set, which is not needed in the Always Enable Set. Therefore, the extra OR logic will be added only when the power saving justifies the extra overhead. Although the algorithm shown and described for FIG. 17 uses a simple greedy method for combining enable domains, one can do the same optimization using more advanced techniques such as linear programming, simulated annealing, etc.

Further Optimization of Enable Tokens

Figure 18:
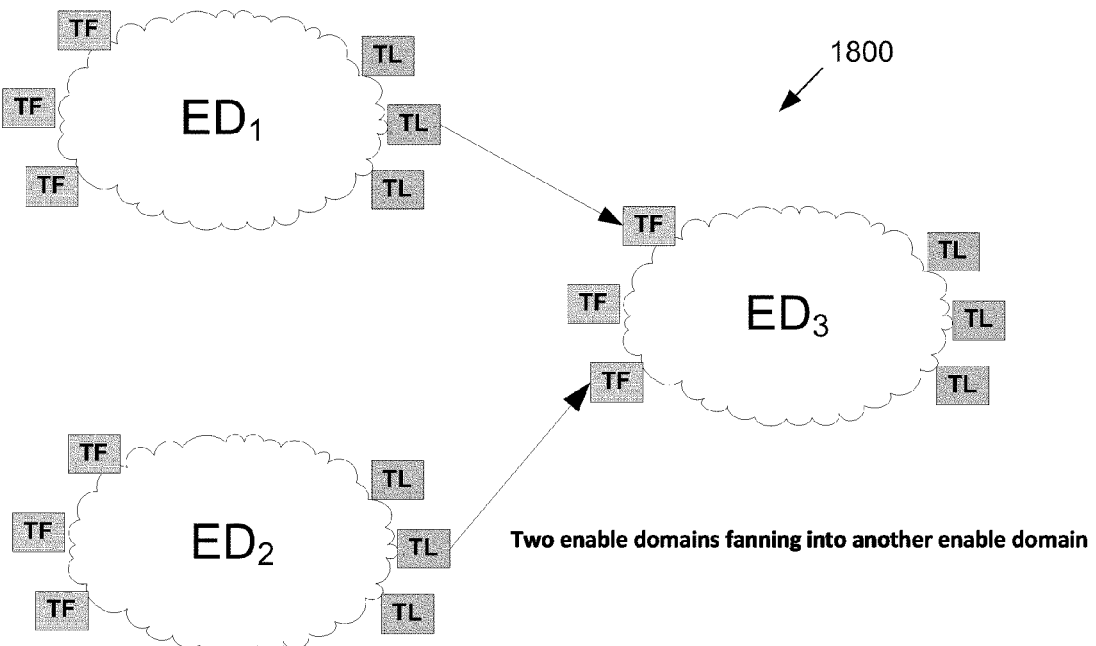
FIG. 18 depicts a graph of two enable domains fanning into another enable domain, in accordance with exemplary embodiments of the present disclosure.

Consider the following example having three enable domains, $EN_1$, $EN_2$, and $EN_3$. $EN_1$ and $EN_2$. There is a channel between $EN_1$ and $EN_2$, where tokens from $EN_1$ and $EN_2$ are consumed by $EN_3$, as shown by the example 1800 in FIG. 18.

Let $en_1$, $en_2$, and $en_3$ be enable tokens of $EN_1$, $EN_2$, and $EN_3$ respectively, and let's assume they are independent of each other. The enable token of $ED_3$ can be further optimized by qualifying en3 by the OR of $en_1$ and $en_2$, i.e., $ED_3$ should be disabled when both $ED_1$ and $ED_2$ are disabled. Therefore, the new $en_3$ value can be calculated as follows:

$$en_{3_{new}} = en_3 \wedge (en_1 \vee en_2)$$

The algorithm adds the extra logic necessary to calculate $en3_{new}$, when the extra power justifies the extra overhead.

Such optimizations can be similar to Stability Condition Analysis in synchronous circuits, discussed in R. Fraer, et al. "A new paradigm for synthesis and propagation of clock gating conditions," Design Automation Conference, 2008. DAC 2008. 45th ACM/IEEE, pp. 658-663 (June 2008), the entire contents of which are incorporated herein by reference. Embodiments of the present disclosure extend the same idea to the asynchronous realm and at a more coarse grain, i.e., enable domains as opposed to pipeline stages.

Clustering

Exemplary Embodiments

Once the enable domains are specified, one can use existing clustering algorithms (e.g., such as described in previously referenced U.S. Provisional Patent Application Ser. No. 61/047,714, filed 24 Apr. 2008 and entitled "Clustering and Fanout Optimizations of Asynchronous Circuits" to G. Dimou and/or as described in C. Wong, et al. "High-level synthesis of asynchronous systems by data-driven decomposition," DAC 2003; the entire contents of both of which are incorporated herein by reference) to cluster modules in each enable domain to share controllers. The clustering algorithm used can optimize power consumption constrained to a given cycle time.

Implementation of Exemplary Embodiments

Once the enable domain optimization is complete, clusters within a region can be combined via existing clustering algorithms to tradeoff control logic overhead and achievable performance (see e.g., U.S. Provisional Patent Application Ser. No. 61/047,714). In particular, after clustering the final netlist can be slack matched (adding clusters where necessary) using several known techniques to balance the asynchronous pipelines and achieve the desired performance (see e.g., P. A. Beerel, et al. "Slack matching asynchronous designs" P. A. Beerel, IEEE International Symposium on Asynchronous Circuits and Systems (ASYNC'06), 2006, the entire contents of which are incorporated herein by reference).

Once the enable domain optimization and clustering is done, the modules described in VerilogCSP format can be implemented individually using any template that can implement the semantics of VerilogCSP. This means that the approach is general and is applicable to design styles that range from single-rail bundled-data implementations to QDI design-styles that use 1-of-N encoding to single-track implementations that use single-track handshaking as well as mixtures of these styles such as Sun's GasP implementation, e.g., as described in Ivan Sutherland and Scott Fairbanks, "GasP: A Minimal FIFO Control" Proceedings of the Seventh International Symposium on Advanced Research in Asynchronous Circuits and Systems, Salt Lake City, Utah, USA. 11-14 Mar. 2001. pp. 46-53. (IEEE 2001), the entire contents of which are incorporated herein by reference. In fact, different clusters can be implemented with different design styles assuming the handshaking interfaces between the clusters are compatible.

In addition, although the VerilogCSP description of the components implicitly models a full-buffer, half-buffer implementations will work equally well as long as the subsequent slack matching takes the specific performance characteristics of the half-buffer implementation into account.

Global Versus Local Evaluation of Enable Signal

FIGS. 11 and 12 depict representative graphs 1100 and 1200 of the UPDATE and NOUPDATE token for each enable domain computed globally and broadcast to the TF and TL modules of their associate enable domain. In this way, when no new tokens are sent to an enable domain, tokens within the domain are not generated or processed. Slack matching can account for these additional broadcast paths.

Alternatively, it is possible for the NOUPDATE value to propagate locally through the entire domains and the OR of enable domains computed at the boundary of enable domains. As described in the following section, an implementation of this alternative is the gated multi-level domino ("GMLD") template, where the NOUPDATE value is captured in a dual-rail control signal between clusters.

Gated Multi-Level Domino (GMLD) Template

Exemplary embodiments of the present disclosure can be implemented for/with gate multi-level domino gated ("GMLD") templates. A GMLD template is a gated version of the multilevel domino template ("MLD"). For a GMLD template, the data path is largely unchanged, and the prime difference lies in the control path. GMLD seeks to exploit the availability of the enable pin on EDFFs on a synchronous circuit. This enable signal is used to disable affected GMLD stages, causing them not evaluate if the data inputs do not change. This effect reduces dynamic switching power, and potentially can reduce the forward latency to a constant value. GMLD introduces an important distinction to the token-flow model of asynchronous computation: two varieties of tokens. One kind of token is a control token, which represents data flow without a re-evaluation of the data elements. The other is a data token, which is equivalent to a tradition asynchronous token. Control tokens preserve liveness and safeness of an asynchronous system, allowing GMLD stages to fire in correct sequence. The fundamental difference is that a control token always skips the evaluation phase of the data logic. Data tokens always require the evaluation of the data logic. Examples of such are described in previously noted and co-owned U.S. Provisional Patent Application Ser. No. 61/043, 988, filed Apr. 10, 2008 and entitled "Gated Multi-Level Domino Template", the entire contents of which are incorporated herein by reference.

For GMLD templates of exemplary embodiments of the present disclosure, the value of the dual-rail control signal is updated with additional gating logic at the boundary of clusters, rather than computed centrally. This is feasible because in each cluster, the control is always active but the datapath is only activated when new input data arrives. The control logic of GMLD template adds extra logic necessary to do the optimizations discussed in previously, i.e., it qualifies the enable token of the next stage with its own enable token.

Also, since GMLD uses dynamic logic gates, which can hold state, using explicit TL modules at the end of enable domains can be avoided. Instead, in the next computation cycle, the last domino stage of an GMLD stage holds the previous token value. The last domino stage gets precharged only if a new token has come in and the previous value is not needed anymore.

The GMLD template represents a specific embodiment in which the combinational logic is implemented with domino logic however other pre-charged and un-precharged logic, including single-rail, can also be used. The GMLD template is described in the form of a signal-transition-graph (STG) for which many implementations, including ones with less concurrency are feasible and known to a typical engineer trained in the art.

One skilled in the art will appreciate that embodiments and/or portions of embodiments of the present disclosure can be implemented in/with computer-readable storage media (e.g., hardware, software, firmware, or any combinations of such), and can be distributed and/or practiced over one or more networks. Steps or operations (or portions of such) as described herein, including processing functions to derive, learn, or calculate formula and/or mathematical models utilized and/or produced by the embodiments of the present disclosure, can be processed by one or more suitable processors, e.g., central processing units ("CPUs) implementing suitable code/instructions in any suitable language (machine dependent on machine independent).

While certain embodiments have been described herein, it will be understood by one skilled in the art that the techniques (methods, systems, and/or algorithms) of the present disclosure may be embodied in other specific forms without departing from the spirit thereof. Accordingly, the embodiments described herein, and as claimed in the attached claims, are to be considered in all respects as illustrative of the present disclosure and not restrictive.

What is claimed is:

1. A computer-executable program product for designing asynchronous circuits, the program product comprising a non-transitory computer-readable storage medium with resident computer-readable instructions, which when loaded in a computer system causes the computer system to:
   (A) receive as an input a synchronous netlist corresponding to a synchronous circuit;
   (B) create a logic cluster configured and arranged to receive and process one or more tokens, the logic cluster comprising:
      combinational logic;
      completion sensing logic;
      a plurality of memory elements; and
      an asynchronous controller, wherein the asynchronous controller has a combined functionality of (a) a token filter (TF) module configured and arranged to (i) receive a token in input channels L and EN, and (ii) send a token on an output channel R based on the value received on EN, (b) a token latch (TL) module configured and arranged to (i) receive a token on an EN channel, (ii) receive a value on an L channel, (iii) based on a value of UPDATE on the L channel, update a value of an internal state variable d with a new value and send a value of d to an output channel R, and (iv) based on a value of NOUPDATE on the L channel send a previously stored value of d to the output channel; and (c) wherein when no new tokens are provided to the cluster, the controller does not re-evaluate a combinational logic datapath and generates and sends information about new tokens to one or more clusters in a fanout of the cluster;
   (C) cause the logic cluster to process one or more tokens; and
   (D) produce as an output an asynchronous netlist of an asynchronous circuit corresponding to the synchronous circuit.

2. The program product of claim 1, wherein a transfer of new tokens sent between clusters is sent via a dual-rail signal.

3. The program product of claim 1, wherein the asynchronous controller implements a signal-transition-graph (STG) that has a full buffer and isolate phases.

4. The program product of claim 1, wherein the combinational logic is implemented with domino logic.

5. The program product of claim 4, wherein the combinational logic is implemented with single-rail logic using a bundled-data-style datapath.

6. The program product of claim 1, wherein the TL module is implemented by not pre-charging the last stage of a domino logic until a new token arrives.

7. The program product of claim 1, further comprising a network of clusters in which a presence of new tokens is transmitted between clusters using dual-rail control signals that are used to avoid re-computation of datapath units.

8. The program product of claim 7, wherein a transmitted value into one enable domain is qualified by ORing of enable signals of all other fanin domains.

9. A computer-implemented method for designing asynchronous circuits, the method comprising:
   inputting to a computer system a synchronous circuit specification including clock-gating logic having a clock network and gating elements;
   removing, using the computer system the clock network and clock gating elements from the synchronous circuit specification;
   generating, using the computer system, an asynchronous circuit specification corresponding to the synchronous circuit; and
   reducing, using the computer system, token flow in the asynchronous circuit specification by implementing a plurality of token filters and a plurality of token latches.

10. The method of claim 9, wherein reducing token flow comprises using enable domains defined by specific combinations of clock-gating enable signals.

11. The method of claim 10, wherein reducing token flow comprises uses token filter and token latch at input and output boundaries of the enable domains.

12. The method of claim 10, further comprising optimizing enable tokens by qualifying an enable token of one enable domain by ORing of the enable tokens of all fan-in enable domains.

13. The method of claim 12, wherein optimizing enable tokens comprises optimizing enable domains using activity factors of enable domains and also correlation between activity factors of different enable domains.

14. The method of claim 10, further comprising combining enable domains to tradeoff the complexity of token flow logic with activity within each final enable domain using a look-ahead algorithm.

15. The method of claim 14, wherein the look-ahead algorithm includes a cost function, a greedy algorithm, a simulated-annealing, or a genetic algorithm.

16. The method of claim 10, wherein computational modules within each domain are combined by a clustering algorithm including a cost function minimizing power consumption.

17. The method of claim 9, further comprising using a classical statistical pattern recognition, a neural network, or heuristics.

18. A computer-executable program product for designing asynchronous circuits, the program product comprising a non-transitory computer-readable storage medium with resident computer-readable instructions, which when loaded in a computer system cause the computer system to:
- use as an input a synchronous circuit netlist including clock-gating logic;
- disable state holding elements in the synchronous circuit netlist;
- generate an asynchronous circuit netlist corresponding to the synchronous circuit; and
- reduce token flow in the asynchronous circuit netlist by implementing a plurality of token filters and a plurality of token latches.

19. The program product of claim 18, further comprising computer-readable instructions for implementing the asynchronous netlist as an asynchronous circuit template.

20. The program product of claim 19, wherein the asynchronous circuit template is selected from the group consisting of PCHB, MLD, bundled-data, and single-track templates.

* * * * *